United States Patent
Waldo et al.

(10) Patent No.: US 11,231,444 B1
(45) Date of Patent: Jan. 25, 2022

(54) ACQUIRING AND DISPLAYING MULTIPLE WAVEFORMS IN A TEST AND MEASUREMENT INSTRUMENT

(71) Applicant: Tektronix, Inc., Beaverton, OR (US)

(72) Inventors: Gary J. Waldo, Hillsboro, OR (US); Stephen LaFrance, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 147 days.

(21) Appl. No.: 16/430,911

(22) Filed: Jun. 4, 2019

Related U.S. Application Data

(60) Provisional application No. 62/745,964, filed on Oct. 15, 2018, provisional application No. 62/681,613, filed on Jun. 6, 2018.

(51) Int. Cl.
  *G01R 13/02* (2006.01)
  *G06F 3/0481* (2013.01)
  *G06F 3/0484* (2013.01)

(52) U.S. Cl.
  CPC ....... *G01R 13/0236* (2013.01); *G06F 3/0481* (2013.01); *G06F 3/0484* (2013.01)

(58) Field of Classification Search
  CPC .. G01R 13/0236; G06F 3/0481; G06F 3/0484
  USPC .................................................. 324/76.19
  See application file for complete search history.

(56) References Cited

U.S. PATENT DOCUMENTS

| | | | |
|---|---|---|---|
| 5,956,013 A * | 9/1999 | Raj ................. | A61B 5/339 345/208 |
| 6,339,416 B1 * | 1/2002 | Kondoh ............... | G09G 3/3633 345/97 |
| 7,236,900 B2 * | 6/2007 | Hagen ................. | G01R 13/206 324/76.22 |
| 2003/0058243 A1 * | 3/2003 | Faust .................. | G06T 11/206 345/440 |
| 2004/0174818 A1 * | 9/2004 | Zocchi ................ | G01R 13/28 370/241 |
| 2006/0250530 A1 * | 11/2006 | Sugiyama ........ | G01R 31/31917 348/739 |

OTHER PUBLICATIONS

Tektronix, Inc., "5 Series MSO Mixed Signal Oscilloscope: 5-minute Overview," Jun. 5, 2017, video 4'27", YouTube.com, available at https://www.youtube.com/watch?v=nwVN-R6yovU, last accessed Jul. 27, 2021.

\* cited by examiner

*Primary Examiner* — Christopher P McAndrew
(74) *Attorney, Agent, or Firm* — Miller Nash LLP; Andrew J. Harrington

(57) ABSTRACT

A test and measurement instrument, comprising a display and one or more processors configured to display a waveform viewing area, receive a selection of a viewing mode. When an overlay viewing mode is selected, display two or more waveforms overlaid in a single graticule in the waveform viewing area, and when a stacked viewing mode is selected, display a first waveform in a first slice having a first graticule in the waveform viewing area and display a second waveform in a second slice having a second graticule below the first slice in the waveform viewing area.

20 Claims, 12 Drawing Sheets

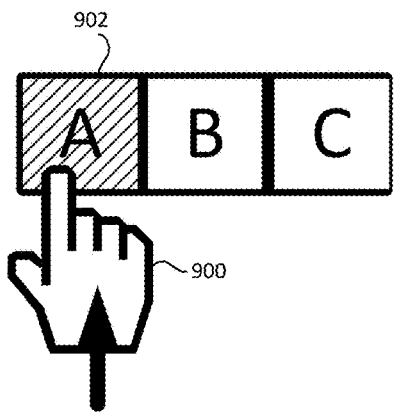
FIG. 9A
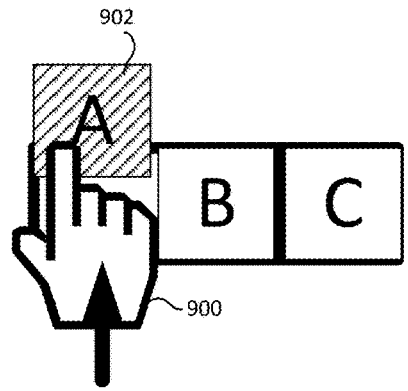
FIG. 9B
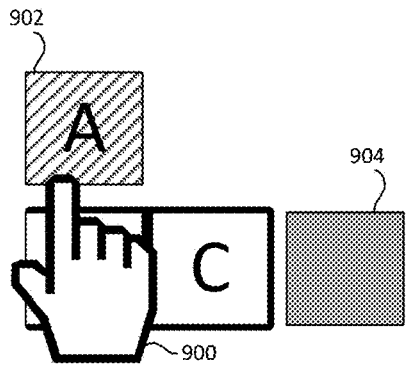
FIG. 9C
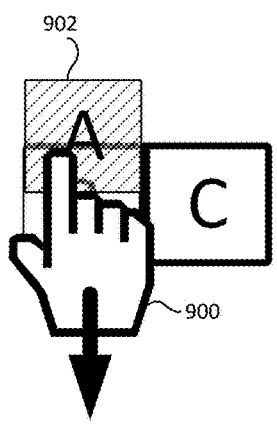
FIG. 9D
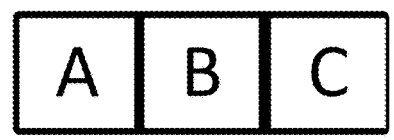
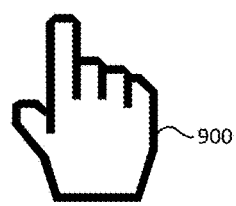
FIG. 9E

ACQUIRING AND DISPLAYING MULTIPLE WAVEFORMS IN A TEST AND MEASUREMENT INSTRUMENT

PRIORITY

This disclosure claims benefit of U.S. Provisional Application No. 62/681,613, titled "ACQUIRING AND PRESENTING MULTIPLE WAVEFORMS IN A TEST AND MEASUREMENT INSTRUMENT," filed on Jun. 6, 2018, and U.S. Provisional Application No. 62/745,964, titled "IMPROVED MODE FOR WAVEFORM DISPLAY AND ANALYSIS IN A TEST AND MEASUREMENT INSTRUMENT," filed on Oct. 15, 2018, each of which is incorporated herein by reference in its entirety.

TECHNICAL FIELD

This disclosure is directed to systems and methods related to test and measurement systems, and in particular, to a graphical user interface of a display of a test and measurement system.

BACKGROUND

Conventional test and measurement instruments, such as oscilloscopes, have primarily displayed all waveforms in a single graticule. A user can separate the waveforms by scaling and positioning each waveform so the waveforms are visually separated, but doing so sacrifices acquisition fidelity and measurement accuracy. Alternatively, each waveform may be scaled and positioned to cover the full display, which provides the highest fidelity acquisitions and most accurate measurements, but requires the waveforms to overlap, which may interfere with visually inspecting each waveform by a user.

In an attempt to rectify this issue, some conventional test and measurement instruments have allowed the user to divide the oscilloscope display into a fixed number of graticules, usually between 1, 2, 4, and 8. However, these graticules are often split into different quadrants of the display, and if the number of needed graticules is different from the fixed number of graticules, a user has wasted display space with an empty graticule not displaying a waveform.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which:

FIGS. 9A-9E illustrate when a badge in a grouping of badges displayed on the display of the test and measurement instrument of FIG. 1 is not moved from a grouping according to some embodiments of the disclosure.

DESCRIPTION

Figure 1:
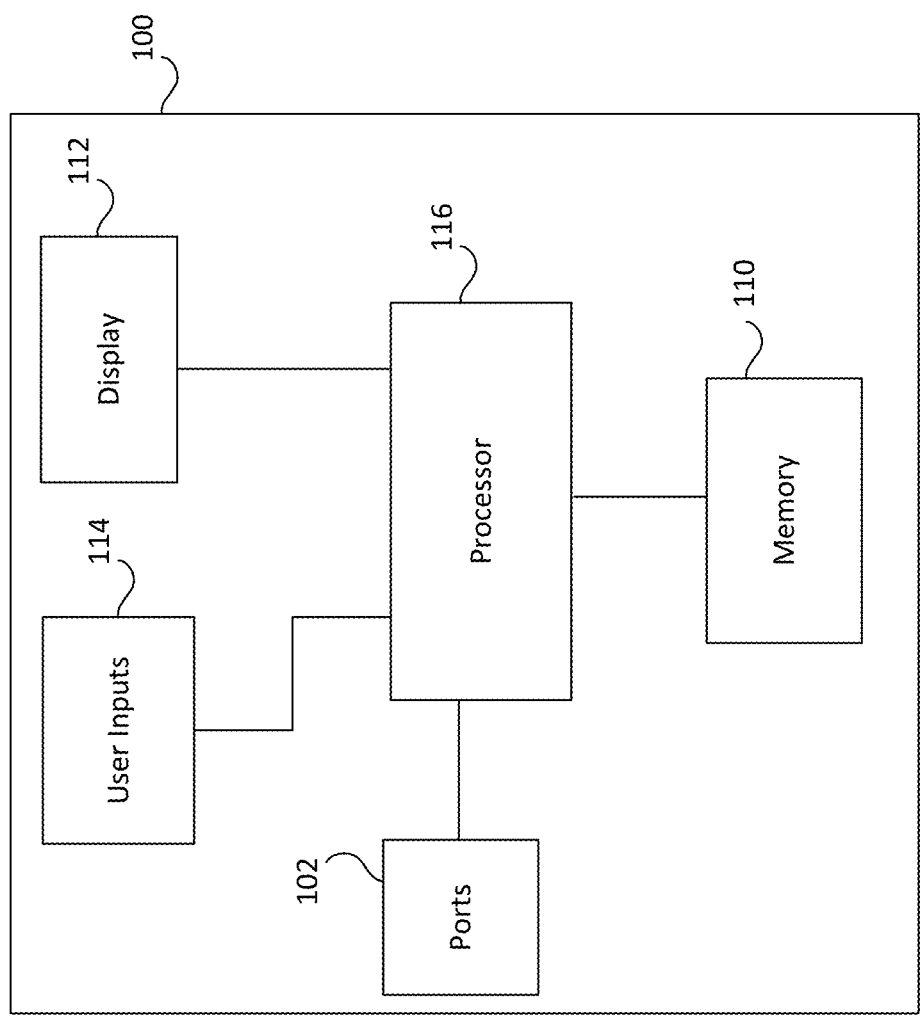
FIG. 1 is a block diagram of a test and measurement instrument according to embodiments of the disclosure.

As mentioned above, test and measurement instruments such as oscilloscopes typically include a display screen for displaying waveform data of input signals acquired by the instrument. A portion of the display screen generally includes a waveform viewing area. The waveform viewing area typically includes a graticule. The graticule is a grid, usually having major divisions ("divisions") along both a horizontal axis and a vertical axis. The graticule may also show minor divisions along one or both axes. Original cathode-ray-tube-based (CRT-based) test and measurement instruments had a graticule etched or printed directly onto the glass screen of the CRT. More modern digital test and measurement instruments generate the graticule in software and display it in the waveform viewing area of the display screen using the display processing components of the oscilloscope.

A conventional graticule for a test and measurement instrument generally shows 10 divisions along the horizontal axis, and 8-10 divisions along the vertical axis. The horizontal axis is typically related to a measure of time in units such as seconds, milliseconds, microseconds, picoseconds, etc., and the vertical axis is typically related to a measure of amplitude or magnitude of an acquired waveform in an appropriate unit for the signal being measured, for example a voltage signal in units of Volts or a current signal in units of Amps. A user may adjust the horizontal scale and/or the vertical scale of the instrument so as to adjust the amount of time per division (i.e., the "time/div") and/or the amount of amplitude per division (i.e., the "Volts/div" or "Amps/div"). Thus, knowing the selected horizontal and vertical scale settings, a user can use the graticule to directly read the values of data points in an amplitude versus time display of a waveform.

In a conventional graticule, the center of the graticule is the origin for both the horizontal and vertical axes. That is, the vertical center of the graticule is considered zero amplitude. In the case of voltages, values above the vertical center are increasingly positive voltages, and values below the vertical are increasingly negative voltages. Likewise, the horizontal center of the graticule is considered the zero time point, relative to a trigger point. Values to the left of the horizontal center are increasingly negative time values, i.e. pre-trigger points in time, and values to the right of the horizontal center are increasingly positive time values, i.e. post-trigger points in time. A user may adjust the vertical position of a displayed waveform to change where on the vertical axis of the graticule is considered the "zero amplitude" level. A user may also adjust the horizontal position of a displayed waveform to change where on the horizontal axis of the graticule is considered the "zero time" point relative to the trigger. A user may also adjust a vertical offset for a displayed waveform to either add or subtract a selected amount of amplitude offset to the displayed signal.

Conventional test and measurement instruments have primarily displayed all acquired waveforms in a single graticule. However, in many cases, this means that the acquired waveforms are displayed overlapping one another. Even though each displayed waveform is often displayed in different colors, this overlapping display can make it difficult for a user to view, analyze, and understand each of the waveforms, especially if two waveforms are very similar. When there is more than one acquired waveform, this conventional approach forces the user to make a compromise between two options.

First, as mentioned above, the user can choose to independently scale and position each waveform so they are visually separated from each other. Again, the disadvantage of this approach is that it compromises and sacrifices signal acquisition fidelity and measurement accuracy. When an instrument acquires a signal, the signal is typically digitized by one or more analog-to-digital converters (ADCs). The input range of an ADC typically goes from the top of the display/graticule to the bottom of the display/graticule, although in some instruments the range of the ADC may extend an extra division above the top of the display/graticule and an extra division below the bottom of the display/graticule to prevent signal clipping when a waveform is scaled to occupy the full vertical axis of the display. If the user has scaled the waveform so that it only occupies 20% of the vertical space on the display, then they are only effectively using 20% of the ADC range. This leads to lower fidelity waveform acquisitions (lower digitization resolution) and less accurate analysis of those waveforms (cursors, measurements, jitter analysis, etc.).

Alternatively, as mentioned above, a second choice is to scale and position each waveform to cover the full display (or close to it). Of course, this has exactly the opposite advantages and disadvantages. In this case, the user is getting the highest fidelity acquisitions and most accurate measurements and analysis, but their waveforms are now likely overlapping, which makes it difficult to visually inspect individual waveform characteristics.

Autoset is a feature found in most conventional test and measurement instruments that scales waveforms (both horizontally and vertically) and adjusts trigger settings in an attempt to provide a stable view of a few cycles of the waveforms currently being displayed. Historically, Autoset has configured waveforms for visibility as opposed to accuracy. In other words, the conventional Autoset feature attempts to automatically make similar scale and position adjustments as would be made by a user under the first choice discussed above, to display all waveforms on screen without overlapping.

As also discussed above, in an attempt to solve this multiple waveform display problem, some conventional test and measurement instruments allow a user to manually select to divide the test and measurement instrument display into a pre-set and fixed number of graticules. Typical choices include 1, 2, 4 and 8. There are tradeoffs with this approach. First, in some cases, the graticules are split up into different quadrants on the display. This makes it harder to visually assess whether details in one waveform are time aligned with aspects of another waveform. Next, the fixed number of graticules is almost never the desired number and the user is forced to make additional tradeoffs. For example, if the user needs to simultaneously display three waveforms, the user needs to select a 4 graticule option. However, in such an instance, approximately a quarter of the display space is unused and wasted. Similarly, to simultaneously view five waveforms, a user would have to select 8 graticules, resulting in three empty graticules. And since only 8 graticules are offered, if a user had ten waveforms to display, then all the waveforms could not be viewed in unique graticules.

Embodiments of the disclosure allow a test and measurement instrument to display multiple waveforms, either in a stacked mode, that is, where the waveforms are visually separated or an overlay mode, where the waveforms are overlaid on each other, without the loss of acquisition fidelity and accuracy of the measurements.

FIG. 1 is a block diagram of an example test and measurement instrument 100, such as an oscilloscope, for implementing embodiments of the disclosure disclosed herein. The test and measurement instrument 100 includes a plurality of ports 102 which may be any electrical signaling medium. Ports 102 may include receivers, transmitters, and/or transceivers. Each port 102 is a channel of the test and measurement instrument 100. The ports 102 are coupled with one or more processors 116 to process the signals and/or waveforms received at the ports 102 from one or more devices under test. Although only one processor 116 is shown in FIG. 1 for ease of illustration, as will be understood by one skilled in the art, multiple processors 116 of varying types may be used in combination, rather than a single processor 116.

The ports 102 can also be connected to a measurement unit in the test instrument 100, which is not depicted for ease of illustration. Such a measurement unit can include any component capable of measuring aspects (e.g., voltage, amperage, amplitude, etc.) of a signal received via ports 102. The test and measurement instrument may include additional hardware and/or processors, such as conditioning circuits, an analog to digital converter, and/or other circuitry to convert a received signal to a waveform for further analysis. The resulting waveform can then be stored in a memory 110, as well as displayed on a display 112. As will be understood by one of ordinary skill in the art, the reference to "an" analog-to-digital converter may include multiple analog-to-digital converters, either multiple analog-to-digital converters each configured to digitize an analog input signal on a respective single input channel of the test instrument 100, or multiple analog-to-digital converters configured to operate together in an interleaved manner to digitize an analog input signal to the test instrument 100.

The one or more processors 116 may be configured to execute instructions from memory 110 and may perform any methods and/or associated steps indicated by such instructions, such as displaying and modifying the GUI of embodiments of the disclosure. Memory 110 may be implemented as processor cache, random access memory (RAM), read only memory (ROM), solid state memory, hard disk drive(s), or any other memory type. Memory 110 acts as a medium for storing data, computer program products, and other instructions.

User inputs 114 are coupled to the processor 116. User inputs 114 may include a keyboard, mouse, trackball, touch-screen, and/or any other controls employable by a user to with a GUI on the display 112. The display 112 may be a digital screen, a cathode ray tube based display, or any other monitor to display waveforms, measurements, and other data to a user. While the components of test instrument 100 are depicted as being integrated within test and measurement instrument 100, it will be appreciated by a person of ordinary skill in the art that any of these components can be external to test instrument 100 and can be coupled to test instrument 100 in any conventional manner (e.g., wired and/or wireless communication media and/or mechanisms). For example, in some embodiments, the display 112 may be remote from the test and measurement instrument 100.

Figure 2:
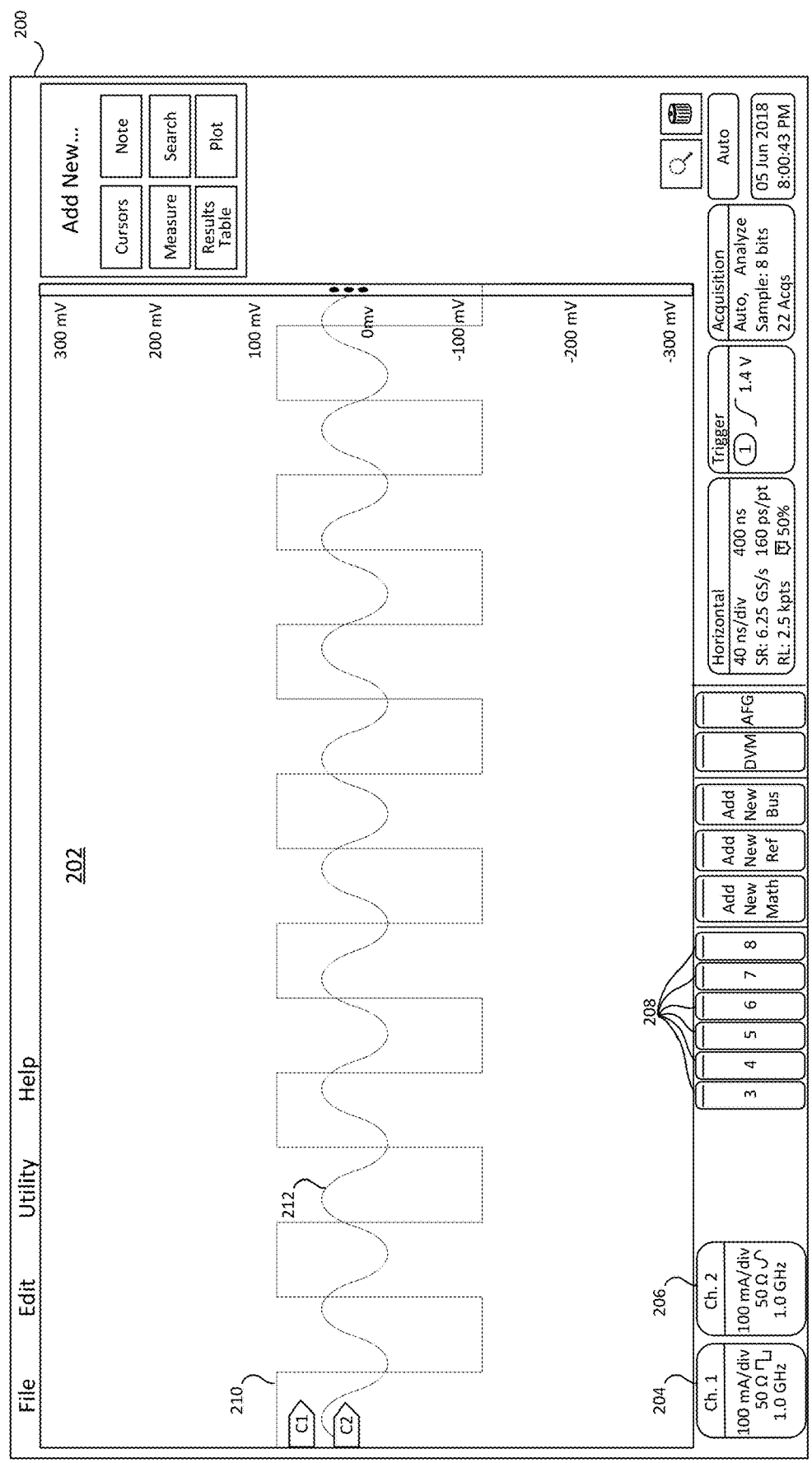
FIG. 2 illustrates an example of a user interface displayed on the display of the test and measurement instrument of FIG. 1 according to some embodiments of the disclosure.

FIG. 2 illustrates an example user interface 200 of a test and measurement instrument 100 that may be displayed on the display 112 of the test and measurement instrument 100. As illustrated in FIG. 2, the user interface 200 includes a waveform viewing area 202 for displaying one or more waveforms, which may represent portions of one or more input signals received at the ports 102. As illustrated in FIG. 2, two channels are active on the display, such that the waveforms representing portions of two input signals received at the two ports 102 associated with the two channels are shown in the waveform viewing area 202. The user interface 200 includes badges 204 and 206 to display information related to the active channels, and buttons 208 for inactive channels.

In FIG. 2, the user interface 200 is set in an overlay mode, so that channels one and two are displayed overlaid on each other in a single graticule. If additional channels were added using buttons 208, then the additional channels would also be overlaid on the waveforms for channels one and two, and additional badges for each added channel would be displayed. In some embodiments, the badges 204 and 206 may be color-coded to match their corresponding waveform on the waveform viewing area 202. For example, the channel one badge 204 may have a yellow banner, may be entirely yellow, or indicate in any other way yellow, and the waveform 210 associated with channel one may also be displayed in yellow. On the other hand, the channel two badge 206 may have a blue banner, may be entirely blue, or any other way blue, and the waveform 212 associated with channel two may also be displayed in blue. Embodiments of the disclosure, however, are not limited to color-coding the badges and waveforms, and any method that shows a correspondence between a waveform and a badge may be used. For example, a waveform may be displayed in a particular pattern and the badge may also show in some way the pattern of the waveform to which it is associated.

Figure 3:
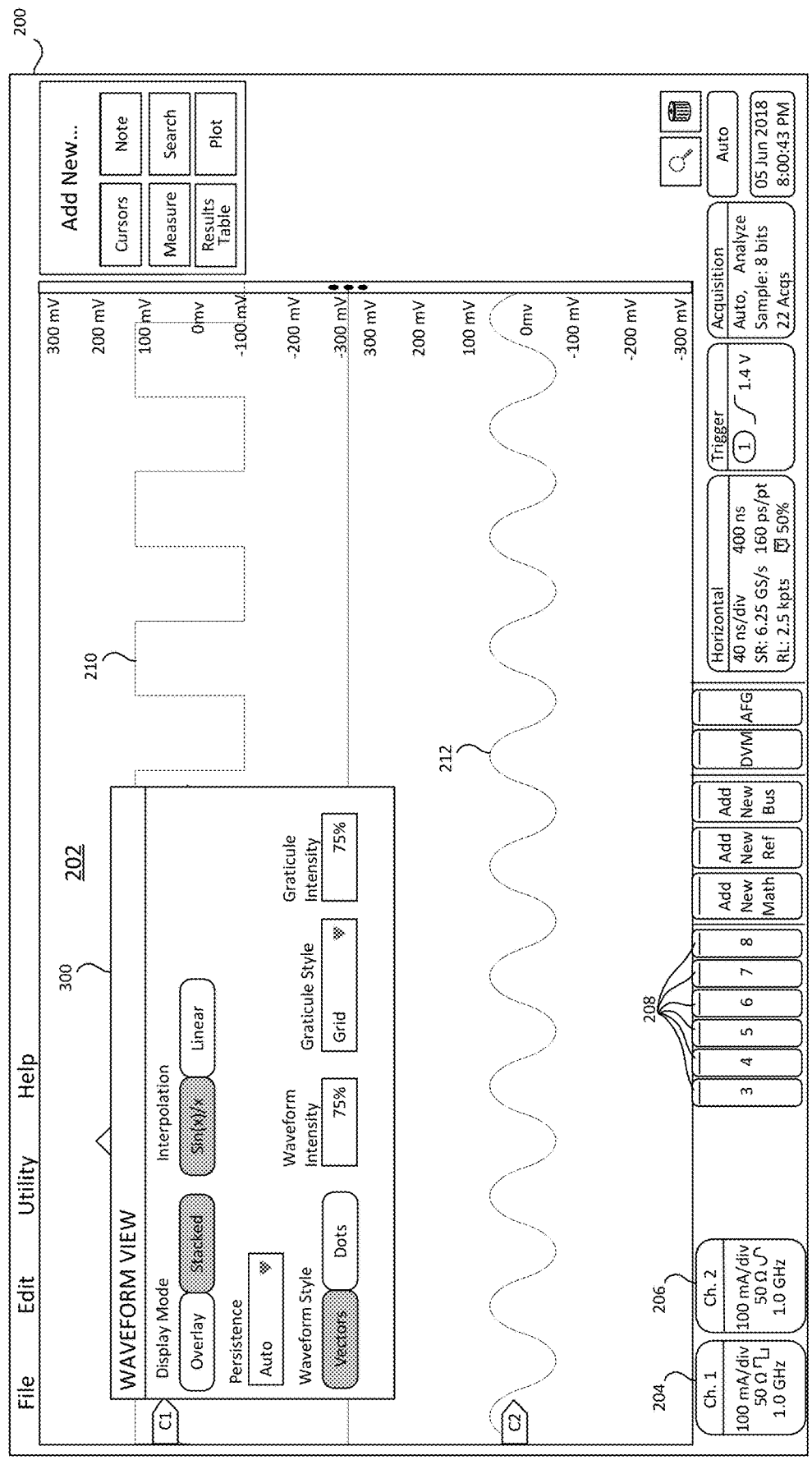
FIG. 3 illustrates an example of a user interface with a menu to change a viewing mode for a waveform viewing area displayed on the display of the test and measurement instrument of FIG. 1 according to some embodiments of the disclosure.

To change a display setting, a user may execute a command, such as a double-tap or double-click anywhere in the waveform viewing area 202 and an expanded contextual menu 300 will be displayed in the waveform viewing area 202, as shown in FIG. 3. A user may select, for example, any type of display settings desired, including a display mode. The display mode, as mentioned above, may be a stacked display mode or an overlay display mode. In the user interface 200 of FIG. 3, a stacked mode has been selected.

Figure 4:
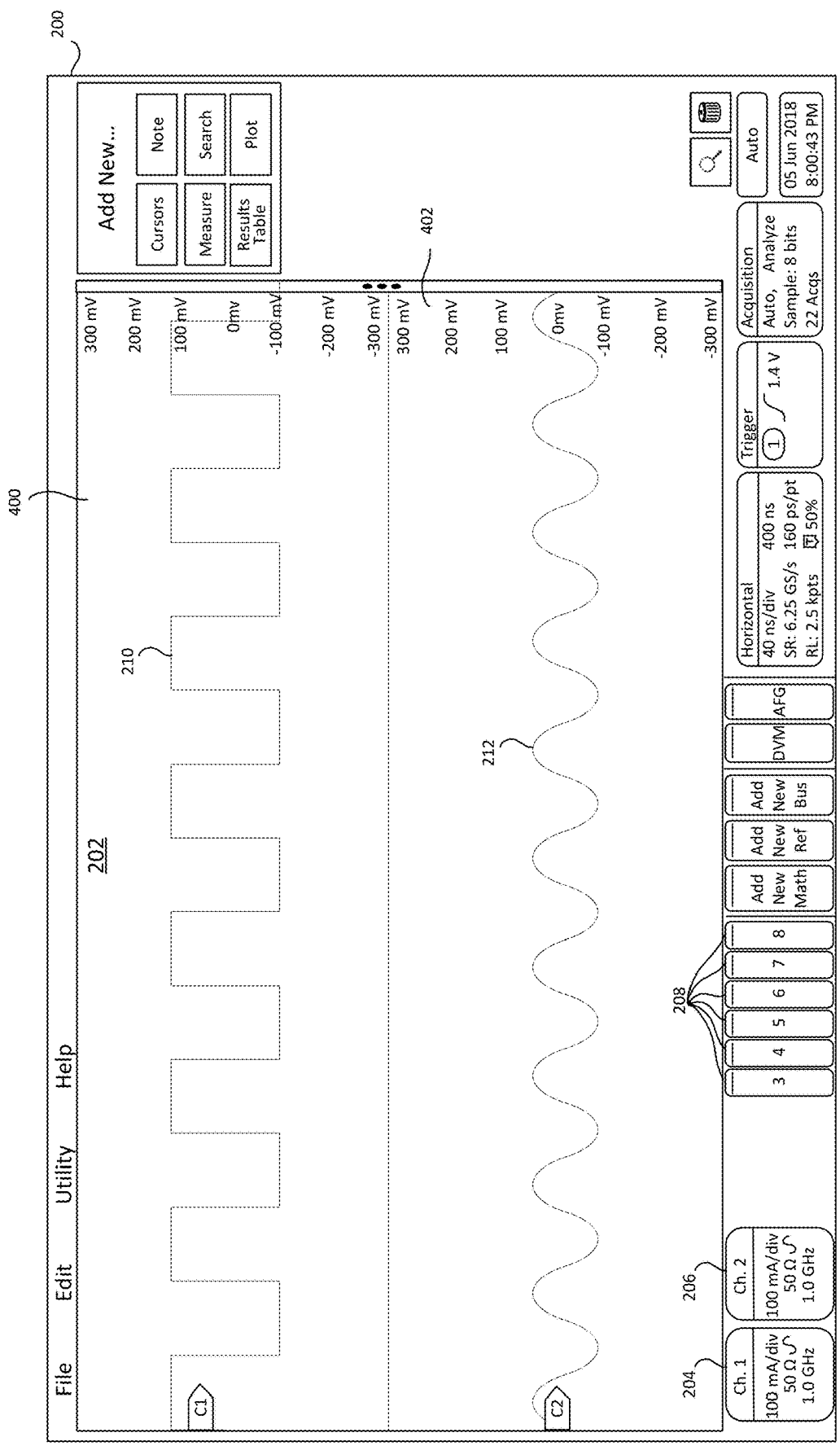
FIG. 4 illustrates an example of a user interface showing a stacked waveform viewing area displayed on the display of the test and measurement instrument of FIG. 1 according to some embodiments of the disclosure.

When the user is finished setting the display settings, the user may tap or click anywhere outside of the expanded contextual menu 300 and the menu will close or disappear. FIG. 4 illustrates the now-selected stacked mode with the expanded contextual menu 300 closed. Each of the waveforms associated with their respective channel is displayed in its own slice. For example, waveform 210 associated with channel one is displayed in slice 400 and waveform 212 associated with channel two is display in slice 402. The slices may be displayed as being vertically "stacked," such that they are all time-aligned. However, each slice has its own independent vertical axis, as shown in FIGS. 3 and 4.

In the stacked display mode, additional graticules, which may be referred to herein as slices, are added and removed automatically as the user adds or removes waveforms from the user interface 200. That is, if a user turns a channel off, then the corresponding waveform and slice are removed from the user interface 200. If a user turns an additional channel on, the new channel is automatically added to the bottom of the stacked waveforms in a new slice.

A new slice may be added for additional features of the test and measurement instrument 100. For example, if a new math waveform, reference waveform, or bus waveform are added, each is provided its own slice in the waveform viewing area 202. Any type of waveform may be displayed in a separate slice when in the stacked display mode. That is, a user may simultaneously display all channels of the test and measurement instrument, as well as any number of additional math, reference, bus, etc. waveforms, up to the memory limits of the test and measurement instrument 100.

The vertical axis of each slice, or graticule, represents substantially the full input range of the analog-to-digital converter of the test and measurement instrument 100. As used in this context, "substantially" means at least approximately 80 percent or more of the input range of the analog-to-digital converter. This allows each acquired waveform to be digitized using substantially the entirety of the ADC range, but still allows the waveforms to be viewed separately, unlike the conventional test and measurement instruments. An Autoset feature may still be provided in the test and measurement instrument 100, but rather than behaving like a conventional test and measurement instrument, the Autoset feature of the disclosed embodiments focuses not on necessarily providing the best visibility, but rather on providing the best accuracy. Thus, in a stacked display mode, when the Autoset feature is enabled, each waveform is set to approximately the middle 80% ADC range automatically, which provides more faithful waveform representations and more accurate measurements. In some embodiments, the digitized waveform may be a frequency domain waveform, for example, a spectrum waveform representing the spectral frequency content of an input signal to the test and measurement instrument. In these embodiments, the Autoset feature may be configured to automatically set the reference level used to generate the spectrum waveform so that the digitized frequency domain waveform is digitized using substantially the full input range of the ADC.

As mentioned above, badges, such as badges 204 and 206, may be added to the user interface 200 that correspond to each waveform displayed in the waveform viewing area 202. As seen in FIGS. 2-4, badges 204 and 206 are provided for channels one and two, respectively. However, a badge may be provided not only for channels, but also for math waveforms, reference waveforms, bus waveforms, etc. The badges 204 and 206 are displayed in the order the waveforms are displayed in the waveform viewing area 202 when in the stacked mode. For example, waveform 210 associated with channel 1 is displayed in the top slice 400 in the waveform viewing area 202 and the badge 204 is shown first in the badge display area. Waveform 212 associated with channel two is displayed on the bottom slice 402 in the waveform viewing area 202 and the badge 206 is shown after badge 204 in the badge display area.

However, an order of the slices may be modified by a user moving the badges 204 and 206 in the badge display area. A user may select a badge, as will be discussed in more detail below, and move it, and the corresponding waveform and slice will change position in the waveform viewing area 202 in response to the movement of the badge. For example, if a user were to move the channel one badge 204 to be after the channel two badge 206, the slice 400 and waveform 210 would move to the bottom of the waveform viewing area 202 while the slice 402 and the waveform 212 would move to the top of the waveform viewing area.

Figure 5:
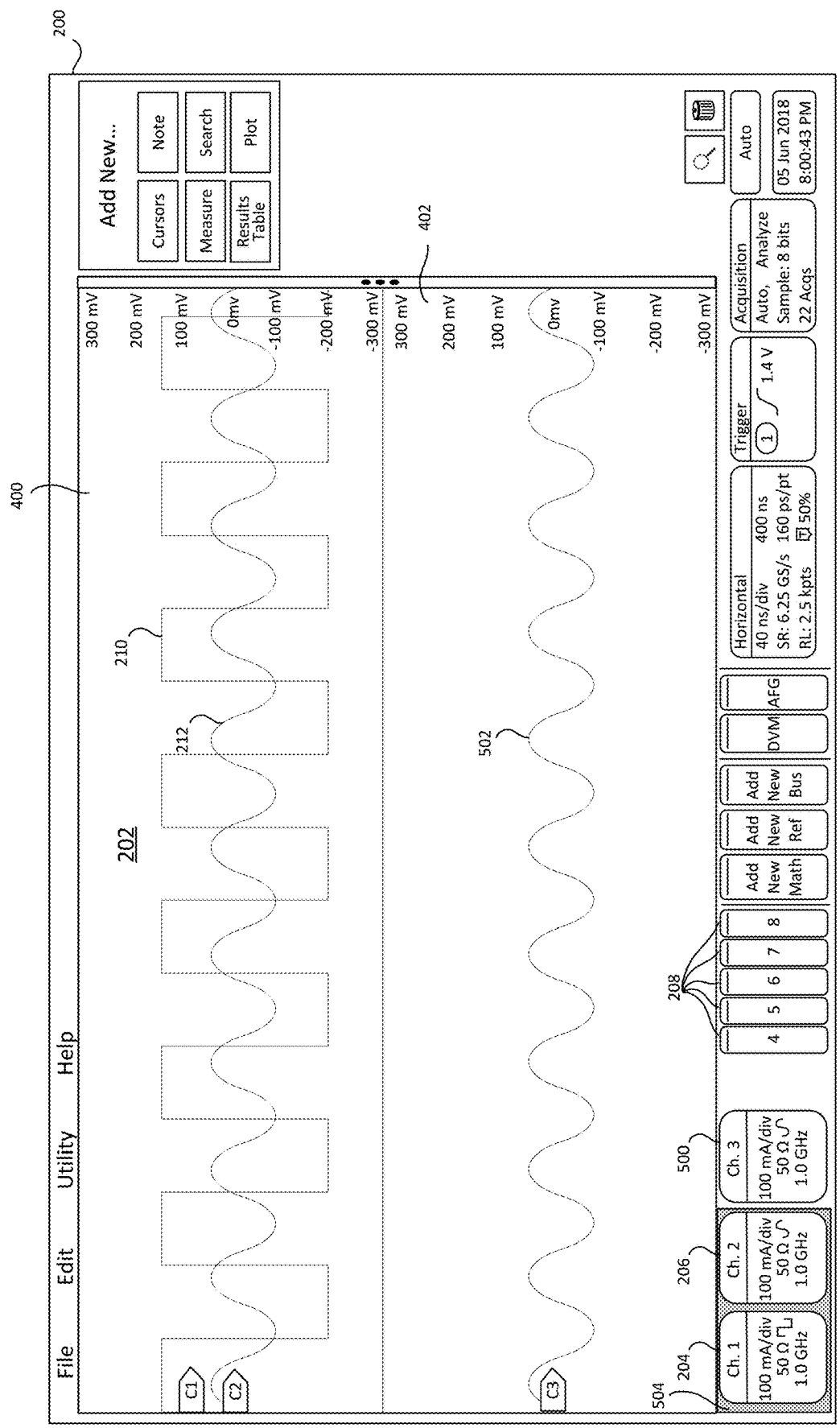
FIG. 5 illustrates another example of a user interface showing a stacked waveform viewing area displayed on the display of the test and measurement instrument of FIG. 1 according to some embodiments of the disclosure.

Further, waveforms may be shown in a modified stacked mode which allows some waveforms to be displayed in an overlay fashion in a common slice, while other waveforms are displayed in their own slices in a stacked mode, as shown in FIG. 5. For this mode, a user sets the display mode to the stacked display mode in the expanded contextual menu 300 shown in FIG. 3. Then, some waveforms and respective channels may be grouped together, such that these waveforms are displayed in an overlaid fashion in a common slice, while the remaining waveforms are displayed in a stacked manner in their own slices.

In FIG. 5, the user interface 200 has been modified such that channels one and two are displayed in an overlay fashion together in common slice 400 and channel three is displayed independently in slice 402, which is stacked with the slice 400. Badges 204, 206, and 500 are shown in the badge display area, corresponding to the different waveforms. As mentioned previously, badges 204 and 206 correspond to waveforms 210 and 212, respectively, while badge 500 corresponds to waveform 502. A grouping icon 504 is displayed with badges 204 and 206 to indicate that the waveforms 210 and 212 are displayed in a single slice 400, overlaid on each other. The grouping icon 504 is an icon that surrounds the badges that are displayed on the single slice 400 to indicate that the badges are grouped together. The grouping icon 504 may be any icon that indicates to a user that the badges within or associated with the grouping icon 504 are grouped together and are displayed on the single slice 400. The badge 500 for channel three is shown separated, and the waveform 502 is shown in its own slice 402.

FIGS. 6A-6D illustrate how the badges, such as badges 204, 206, and 500 are moved to reorder the slices shown in the waveform viewing area 202. In FIGS. 6A-6D, five badges A-E are shown. As mentioned above, a badge is displayed in the badge display area for each waveform shown in the waveform viewing area 202, and indicates the order of the waveforms in the waveform viewing area 202 when in a stacked mode. So, in this example and in this state, the waveform viewing area 202 corresponding to the five badges A-E would be displaying five separate, stacked waveforms.

Figure 6A:
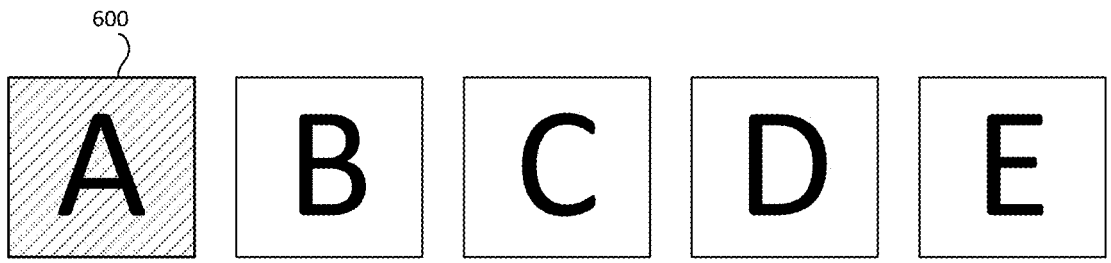
FIGS. 6A-6F illustrate moving of a badge on the user interface displayed on the display of the test and measurement instrument of FIG. 1 according to some embodiments of the disclosure.
Figure 6B:
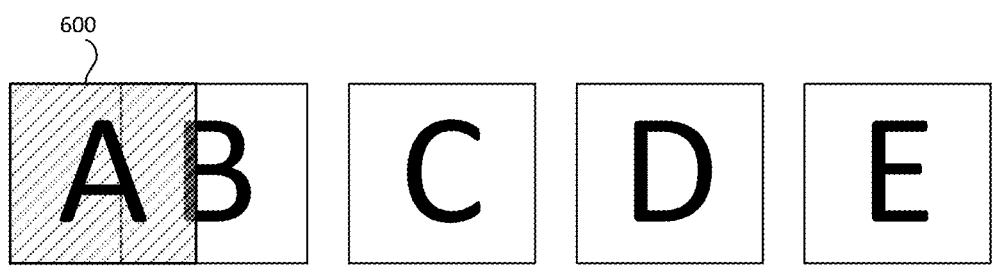
Figure 6C:
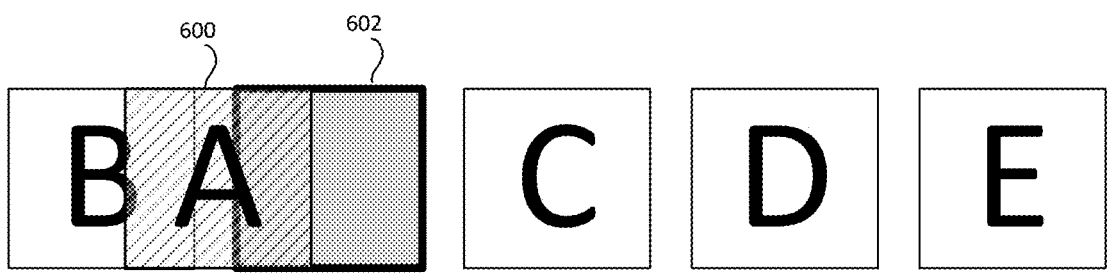

A user may select a particular badge by clicking or touching the badge on the user interface 200. The selected badge 600 may be highlighted in some manner to alert the user the badge has been selected, such as changing the color of the badge, putting an icon around the badge, or any other method indicating the badge is selected by a user. In FIG. 6A, badge A is the selected badge 600. When the user begins to move the selected badge 600, the selected badge 600 may become semitransparent and be seen on top of the remaining badges, as seen in FIG. 6B. Once a mouse cursor or a user's finger has exceeded a predetermined percentage, such as 50%, across the next badge, badge B in FIGS. 6B and 6C, a spacer 602 is displayed where the selected badge 600 may be dropped. If the user were to release the selected badge 600, the selected badge 600, or badge A, would be placed between badges B and C, and the corresponding slice and waveform would be moved on the waveform viewing area 202 to be located between the slices associated with badge B and badge C.

Figure 6D:
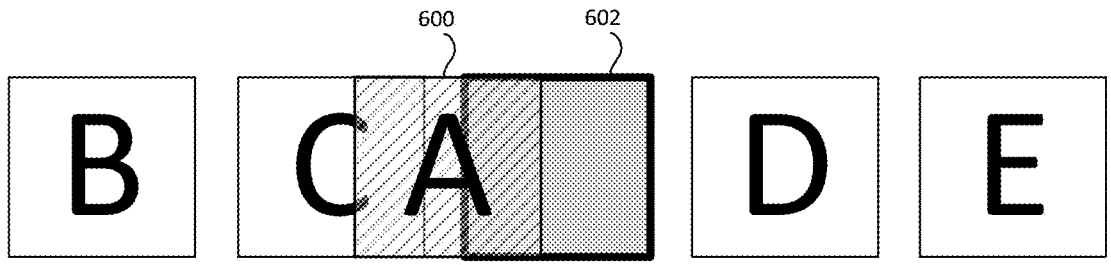
Figure 6E:
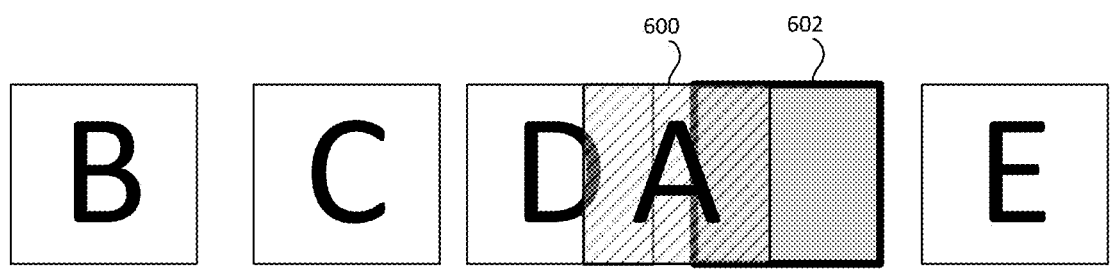
Figure 6F:
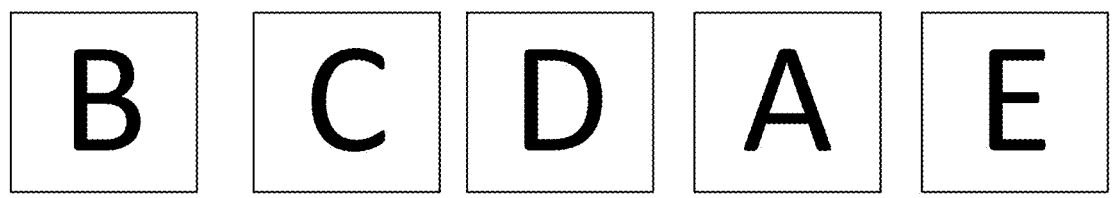

However, as seen in FIGS. 6D-6F, in this example, the user has not released the selected badge 600, but rather continues to move the badge to the right. In FIG. 6D, the spacer 602 is displayed after badge C when the selected badge 602 is a predetermined percentage across badge C. In FIG. 6E, the spacer 602 is displayed after badge D when the selected badge 602 is the predetermined percentage across badge D. In FIG. 6F, the user has released the selected badge 602, and the badges are then displayed in the order shown in FIG. 6F. The slices in the waveform viewing area 202 will be displayed in the same order from top to bottom. Although 50% is provided as an example predetermined percentage, embodiments of the disclosure are not limited to this example and the predetermined percentage may be between 1% and 99%.

FIGS. 7A-7F illustrate an example for creating groups of badges in the stacked mode, such that some waveforms are displayed in an overlay fashion and other waveforms are displayed in a stacked manner, such as that shown in FIG. 5.

Figure 7A:
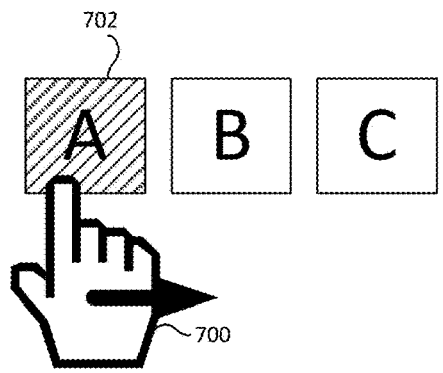
FIGS. 7A-7F illustrating grouping badges to overlay waveforms in a stacked waveform viewing area displayed on the display of the test and measurement instrument of FIG. 1 according to some embodiments of the disclosure.
Figure 7B:
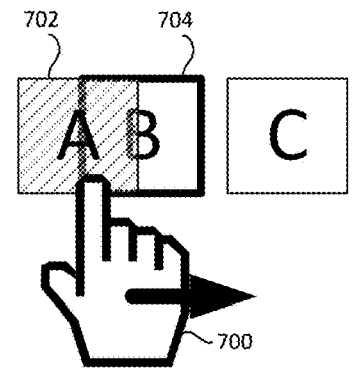
Figure 7C:
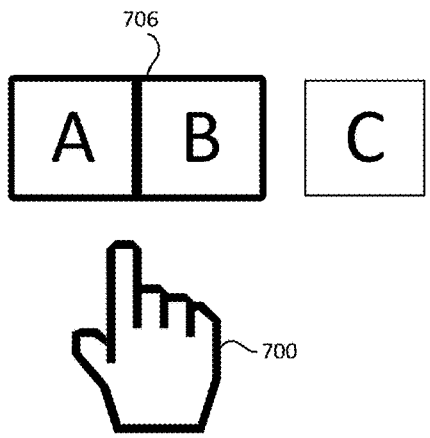

In FIG. 7A, a user 700 may select a badge either by touching or clicking a desired badge to move. The selected badge 702 may be moved by the user 700 to the right, as shown in FIG. 7B. As the selected badge 702 is moved, it may become semitransparent, so that a "ghost" image is shown of the selected badge 702. When the selected badge 702 is placed over another badge, badge B in FIG. 7B, the other badge 704 may become highlighted in some manner, such as by becoming brighter, receiving a border of a different color, or being bold. When the user 700 releases the selected badge 702 over the other badge 704, then a group 706 is formed as shown in FIG. 7C. In FIG. 7C, badges A and B are grouped together in group 706 and badge C remains separate. Accordingly, in the waveform viewing area 202, the waveforms associated with badges A and B would be shown in the same top slice and the waveform associated with badge C would be simultaneously shown in a separate, bottom slice.

When grouping is performed, rather than having a single predetermined percentage for moving a first badge after a second badge, two predetermined percentages, or thresholds may be provided. For example, the thresholds may be 25% and 75%. When the first badge is released when between these thresholds over the second badge, a grouping is formed. If the first badge is greater than 75% of the way across the second badge, then the first badge may be moved after or past the second badge, as discussed above with respect to FIGS. 6A-6F. If the first badge is released when only 25% across the second badge, then the first badge returns to its original position. Although 25% and 75% are shown as example thresholds, thresholds are not limited to these percentages and may be lower or higher.

Figure 7D:
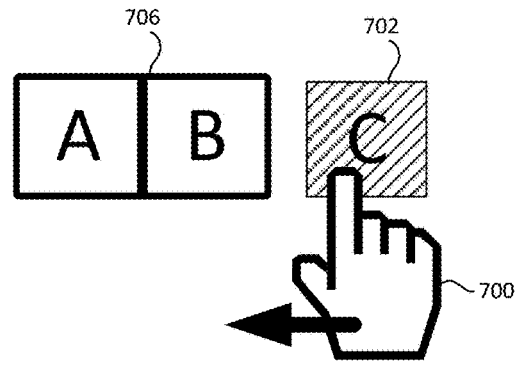
Figure 7E:
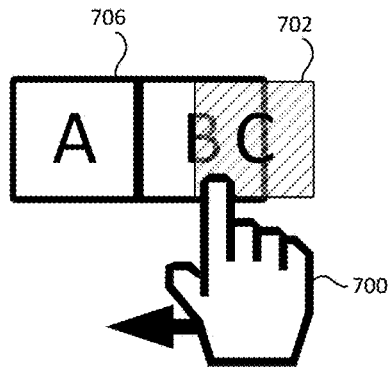
Figure 7F:
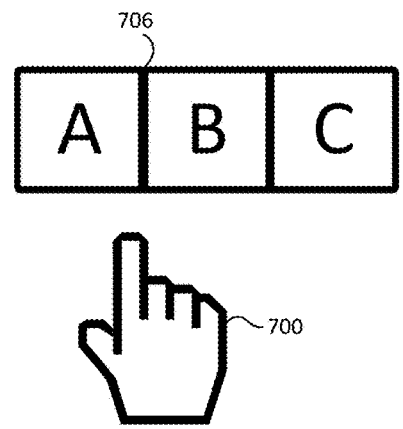

Groups are also not limited to two badges. Any number of badges may be grouped together and shown in the same slice in the waveform viewing area 202. For example, as shown in FIGS. 7D-7F, badge C is also added to the grouping. In FIG. 7D, badge C becomes the selected badge 702 and the user 700 moves the selected badge 702 toward the grouping 706, as shown in FIG. 7E. When the user releases the selected badge 702 on top of the grouping 706, badge C is added to the grouping 706. In such a situation, the waveforms associated with each of badges A, B, and C are shown in the same slice, or graticule, in the waveform viewing area 202, overlaid on top of each other.

As mentioned above, and shown in FIGS. 7C-7F, the groupings 706 may have an indicator to indicate that the badges are grouped together. For example, a rectangle of a particular color or pattern may be provided behind the badges that are grouped together. The color or pattern may be selected based on which badge in the group is selected. For example, the indicator may take on the color or pattern of the badge that the selected badge 702 is placed on top of to create the group. That is, in FIG. 7C, the indicator may take on the color or pattern of badge B, since badge A was the selected badge 702 and dropped on to badge B. In other embodiments, the group 706 may take on the color or pattern of the selected badge 702.

Figure 8A:
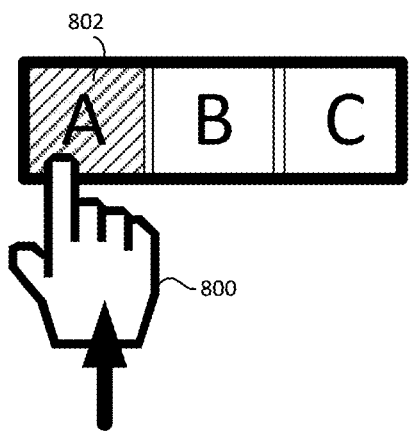
FIGS. 8A-8D illustrate ungrouping a badge from a grouping of badges displayed on the display of the test and measurement instrument of FIG. 1 according to some embodiments of the disclosure.
Figure 8B:
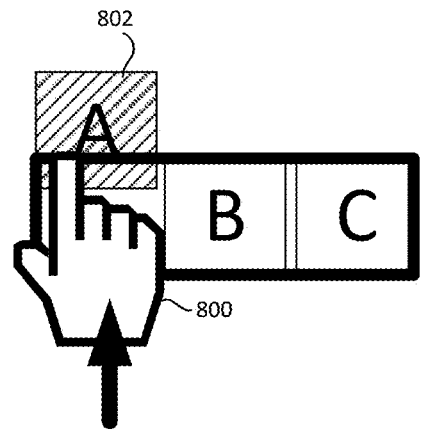

FIGS. 8A-8D illustrate removing a badge from a group. In FIG. 8A, badges A, B, and C are grouped together. A user 800 may desire to remove badge A from the grouping, and so the user selects badge A as the selected badge 802. The user 800 may then drag the selected badge A out of the grouping, such as by moving the selected badge 802 in an upward direction, as shown in FIG. 8B, downward direction, sideways direction, diagonal direction, or any other direction that moves the badge out of the grouping.

Figure 8C:
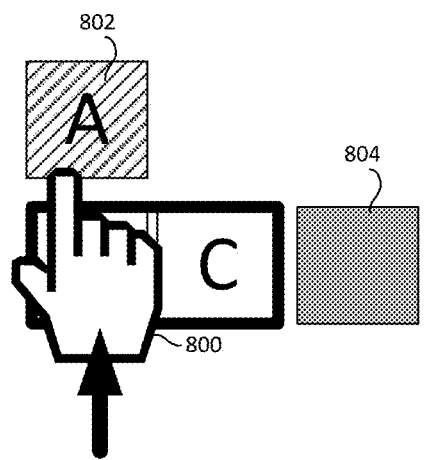
Figure 8D:
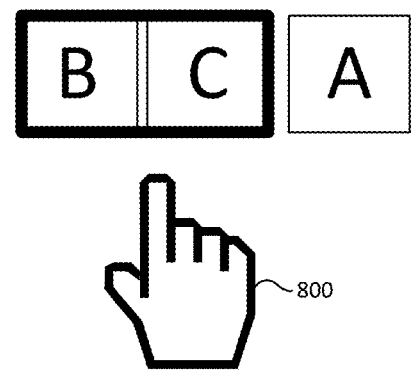

Once the selected badge 802 leaves the grouping, as shown in FIG. 8C, then the grouping shrinks to include the remaining badges, or to a single badge if the original grouping was two badges, and a spacer 804 will be displayed that will indicate where the selected badge 802 will be placed if the user releases the selected badge 802. In FIG. 8D, the user 800 has released badge A, and the waveform associated with badge A is now shown in its own slice of the waveform viewing area 202 after the slice displaying the grouping of the waveforms associated with badges B and C.

FIGS. 9A-9E illustrate what happens when the selected badge 902 is not released by a user 900 outside of the grouping. FIGS. 9A-9C are similar to FIGS. 8A-8C. That is, a user has selected badge A as the selected badge 902 and has moved the selected badge 902 upward, and in FIG. 9C, a spacer 904 is shown where the selected badge 902 will go if released. However, in FIG. 9D, a user 900 has changed their mind and brings the selected badge 902 back down into the grouping. In such an instance, the spacer disappears, as shown in FIG. 9D, and if the user releases, the grouping returns as shown in FIG. 9E.

Not only individual badges may be moved, but groups of badges may also be moved, and the corresponding slice in the waveform viewing area 202 is moved in response to the moving of the grouped badges. FIGS. 10A-10F illustrate moving a grouped set of badges.

Figure 10A:
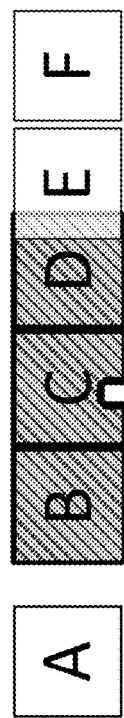
FIGS. 10A-10F illustrate moving a grouping of badges in a stacked waveform viewing area displayed on the display of the test and measurement instrument of FIG. 1 according to some embodiments of the disclosure.
Figure 10B:
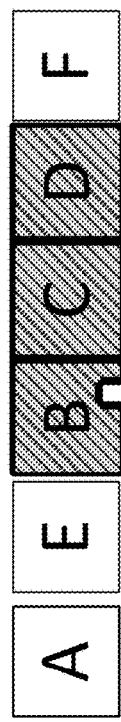
Figure 10C:
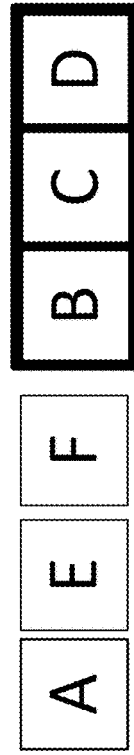
Figure 10D:
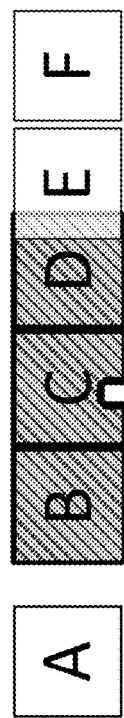
Figure 10E:
Figure 10F:
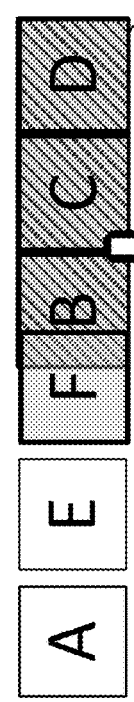

In FIG. 10A, the group containing badges B, C, and D is selected as a selected group badge 1002. When the selected group badge 1002 begins to move, the selected group badge 1002 may be shown as a ghost image. A user 1000 begins to move the selected group badge 1002 to the right, as shown in FIG. 10B. When moving a selected group badge 1002, as the selected group badge 1002 moves over other badges, the remaining badges will move in the opposite direction and the selected group badge 1002 will move into the now open space, as shown in FIGS. 10C-10E. In the instance of a selected group badge 1002, the other badges move relative to the group and not relative to a user's touch or a cursor. In FIG. 10F, the selected badge group 1002 has been released and the slice associated with the grouping is now shown at the bottom of the waveform viewing area 202, since the grouping is at the end of the listed badges.

In the figures, only one group of badges is shown for ease of illustration, but embodiments of the disclosure are not limited to a single grouping of badges. Rather, multiple groupings of badges may be provided. For example, if channels one and two are grouped together, channels one and two will be displayed in an overlaid fashion in a first slice, while channels three, four, and five may be grouped and displayed in an overlaid fashion in a second slice.

If a grouping of badges gets large enough that they do not fit in their designated area of the user interface 200, then a scroll bar may be provided to indicate that there are additional badges within the grouping. When a scroll bar or button is used, the badges may move one at a time, and will move a badge on the other side off the display area.

Dragging or moving a badge to an already created or defined group may cause a visual treatment of the entire group to appear to indicate to the user that the selected badge may be added to the group. Generally, the newly added badge is added to the end of the grouping. Further, if a user wishes to remove the grouping entirely, rather than removing each badge individually, as discussed above, the user may be able to select the group and a menu may expand which has an option to ungroup all of the badges. When the whole grouping is removed, each waveform is shown in its own respective slice in the waveform viewing area 202.

Figure 11:
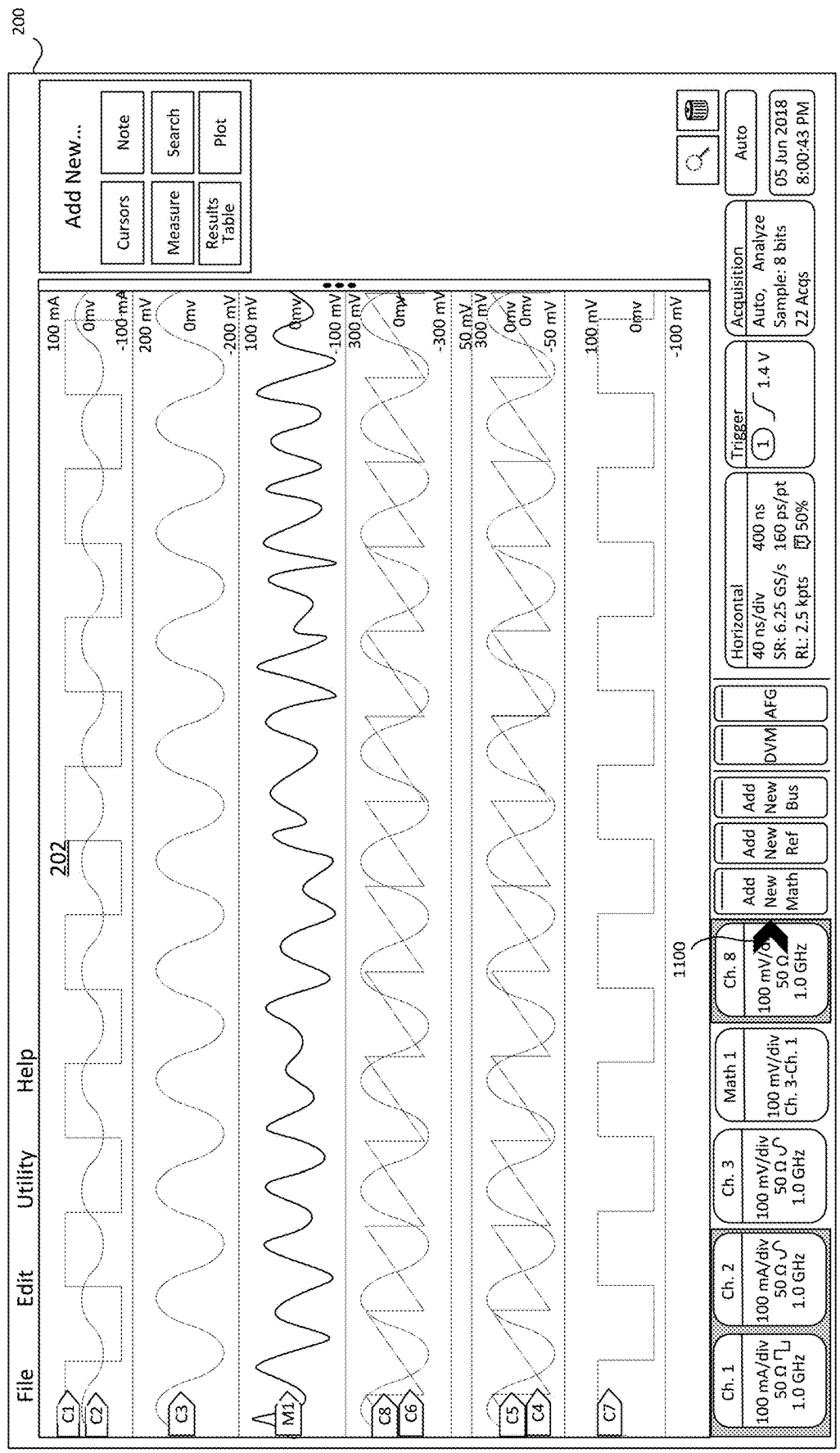
FIG. 11 illustrates an example stacked waveform viewing area with a number of waveforms, some of which are shown grouped, displayed on the display of the test and measurement instrument of FIG. 1 according to some embodiments of the disclosure.

FIG. 11 is an example of the user interface 200 displaying eight waveforms, corresponding to eight input channels of the test and measurement instrument in a waveform viewing area 202, as well as a math waveform. The waveform viewing area 202 is in a stacked mode and has six slices. As can be seen, each slice has its own independent vertical axis.

Some of the channels are grouped together and the waveforms associated with those channels are shown in an overlaid fashion. The math waveform could also have been grouped in with any of the other waveforms. An icon 1100 is provided in the badge viewing area to indicate that there are additional badges for the displayed waveform that do not fit in the badge viewing area. A user may select the icon and the badges will scroll to the left to display additional badges.

Although six slices or graticules are shown in FIG. 11 as an example, any number of slices may be provided, as discussed above, up to the limits of the memory 110 of the test and measurement instrument 100.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a test and measurement instrument, comprising a display; and one or more processors configured to display a waveform viewing area; receive a selection of a viewing mode; when an overlay viewing mode is selected, display two or more waveforms overlaid in a single graticule in the waveform viewing area; and when a stacked viewing mode is selected, display a first waveform in a first slice having a first graticule in the waveform viewing area and display a second waveform in a second slice having a second graticule below the first slice in the waveform viewing area.

Example 2 is the test and measurement instrument of example 1, further comprising an analog-to-digital converter configured to digitize an analog input signal to the test and measurement instrument, wherein when the stacked viewing mode is selected, a vertical axis of each slice represents substantially the full input range of the analog-to-digital converter.

Example 3 is the test and measurement instrument of example 2, where the one or more processors are further configured to receive an autoset selection, and in response to the autoset selection, set each waveform in each slice to be in a middle 80 percent range of the analog-to-digital converter.

Example 4 is the test and measurement instrument of any one of examples 1-3, wherein when the stacked viewing mode is selected, the one or more processors are further configured to display the second waveform and a third waveform, overlaid on the second waveform, in the second slice.

Example 5 is the test and measurement instrument of example 4, wherein the one or more processors are further configured to display the second waveform and the third waveform overlaid in the second slice in response to a user selection to group the second waveform and the third waveform.

Example 6 is the test and measurement instrument of any one of examples 1-5, wherein the one or more processors are further configured to remove a first slice and the first waveform based on a user input to remove the first waveform.

Example 7 is the test and measurement instrument of any one of examples 1-6, wherein the first slice and the second slice are time-aligned and have the same horizontal axis and the first slice and the second slice each have independent vertical axes.

Example 8 is the test and measurement instrument of any one of examples 1-7, wherein when the stacked viewing mode is selected, the one or more processors are further configured to display a third waveform in a third slice having a third graticule below the second slice in the waveform viewing area when a selection is received to add the third waveform.

Example 9 is the test and measurement instrument of any one of examples 1-8, wherein the one or more processors are further configured to receive the selection of the viewing mode from a user interface.

Example 10 is one or more computer-readable storage media comprising instructions, which, when executed by one or more processors of a test and measurement instrument, cause the test and measurement instrument to display a waveform viewing area; receive a selection of a viewing mode; when an overlay mode is selected, display two or more waveforms overlaid in a single graticule in the waveform viewing area; and when a stacked mode is selected, display a first waveform in a first slice in the waveform viewing area and display a second waveform in a second slice below the first slice in the waveform viewing area.

Example 11 is the one or more computer-readable storage media of example 10, wherein the test and measurement instrument includes an analog-to-digital converter configured to digitize an analog input signal to the test and measurement instrument, and wherein a vertical axis of each slice represents substantially the full input range of the analog-to-digital converter.

Example 12 is the one or more computer-readable storage media of example 11, further comprising instructions configured to cause the test and measurement instrument to receive an autoset selection, and in response to the autoset selection, set each waveform in each slice to be in a middle 80 percent range of the analog-to-digital converter.

Example 13 is the one or more computer-readable storage media of any one of examples 10-12, wherein when the stacked mode is selected, further comprising instructions configured to cause the test and measurement instrument to display the second waveform and a third waveform, overlaid on the second waveform, in the second slice.

Example 14 is the one or more computer-readable storage media of example 13, wherein the second waveform and the third waveform are overlaid in the second slice in response to a user selection to group the second waveform and the third waveform.

Example 15 is the one or more computer-readable storage media of any of examples 10-14, further comprising instructions configured to cause the test and measurement instrument to remove a first slice and the first waveform based on a user input to remove the first waveform.

Example 16 is the one or more computer-readable storage media of any one of examples 10-15, wherein the first slice and the second slice are time-aligned and have the same horizontal axis and the first slice and the second slice each have independent vertical axes.

Example 17 is the one or more computer-readable storage media of any one of examples 10-16, further comprising instructions configured to cause the test and measurement instrument to display, when in the stacked mode, a third slice below the second slice with a third waveform when a selection is received to add the third waveform.

Example 18 is the one or more computer-readable storage media of any one of examples 10-17, further comprising instructions configured to cause the test and measurement instrument to receive the selection of the viewing mode from a user interface.

Example 19 is a method for displaying a waveform viewing area on a display of a test and measurement instrument, the method comprising displaying a waveform viewing area; receiving a selection of a viewing mode; when a stacked mode is selected, displaying a first waveform in a first slice in the waveform viewing area and display a second waveform in a second slice below the first slice in the waveform viewing area.

Example 20 is the method of example 19, wherein a range of an analog-to-digital converter for each waveform is fully contained in each slice.

Example 21 is the method of example 20, further comprising receiving an autoset selection, and in response to the autoset selection, setting each waveform in each slice to be in a middle 80 percent range of the analog-to-digital converter.

Example 22 is the method of any one of examples 19-21, wherein when the stacked mode is selected, displaying the second waveform and a third waveform, overlaid on the second waveform, in the second slice.

Example 23 is the method of example 22, wherein the second waveform and the third waveform are overlaid in the second slice in response to a user selection to group the second waveform and the third waveform.

Example 24 is the method of any one of examples 19-23, further comprising deleting a first slice and the first waveform based on a user input to remove the first waveform.

Example 25 is the method of any one of examples 19-24, wherein the first slice and the second slice are time-aligned and have the same horizontal axis and the first slice and the second slice each have independent vertical axes.

Example 26 is the method of any one of examples 19-25, further comprising displaying, when in the stacked mode, a third slice below the second slice with a third waveform when a selection is received to add the third waveform.

Example 27 is the method of any one of examples 19-26, further comprising receiving the selection of the viewing mode from a user interface.

Example 28 is a test and measurement instrument, comprising a display; and one or more processors configured to display a waveform viewing area having two or more slices displayed in a stacked manner, each slice associated with at least one waveform; display in a badge viewing area a badge associated with each waveform in the waveform viewing area, the badges displayed in order of the two or more slices; receive a user input to reorder the badges displayed in the badge viewing area; and in response to the reordering of the badges, reorder the two or more slices in the order of the reordered badges.

Example 29 is the test and measurement instrument of example 28, wherein the one or more processors are further configured to display a spacer between a first badge and a second badge when a third badge is being moved across the first badge.

Example 30 is the test and measurement instrument of example 29, wherein when the third badge is released by a user at equal to or greater than a predetermined percentage across the first badge, the one or more processors are further configured to move and display the third badge between the first badge and the second badge.

Example 31 is the test and measurement instrument of either one of examples 29 or 30, wherein the one or more processors are further configured to receive a selection to move a first badge over a second badge; indicate a grouping of the first badge and the second badge in response to the selection from the user to move the first badge over the second badge; and display the waveform associated with the first badge and the waveform associated with the second badge in the same slice in response to the selection from the user to move the first badge over the second badge.

Example 32 is the test and measurement instrument of example 31, wherein the one or more processors are further configured to group the first badge and the second badge and display the waveform associated with the first badge and the waveform associated with the second badge in the same slice when the first badge is greater than a first threshold across the second badge and less than a second threshold.

Example 33 is the test and measurement instrument of example 32, wherein the one or more processors are further configured to move the first badge after the second badge when the first badge is greater than the second threshold across the second badge.

Example 34 is the test and measurement instrument of any one of examples 32 or 33, wherein the first threshold is 25 percent and the second threshold is 75 percent.

Example 35 is the test and measurement instrument of any one of examples 31-34, wherein the one or more processors are further configured to receive a selection of the first badge to move the first badge out of the grouping and in response place the first badge at an end of the order of the badges and display a slice with the waveform associated with the first badge at the bottom of the stacked slice.

Example 36 is the test and measurement instrument of any one of examples 31-35, wherein the one or more processors are further configured to receive a selection to move the grouping and in response to moving the grouping, move the slice associated with the grouping in the waveform viewing area.

Example 27 is one or more computer-readable storage media comprising instructions, which, when executed by one or more processors of a test and measurement instrument, cause the test and measurement instrument to display a waveform viewing area having two or more slices displayed in a stacked manner, each slice associated with at least one waveform; display in a badge viewing area a badge associated with each waveform in the waveform viewing area, the badges displayed in order of the two or more slices; receive a user input to reorder the badges displayed in the badge viewing area; and in response to a user input reordering the order of the badges, reorder the two or more slices in the order of the reordered badges.

Example 38 is the one or more computer-readable storage media of example 37, further comprising instructions configured to cause the test and measurement instrument to display a spacer between a first badge and a second badge when a third badge is being moved across the first badge.

Example 39 is the one or more computer-readable storage media of example 38, wherein when the third badge is released by a user at equal to or greater than a predetermined percentage across the first badge, further comprising instructions configured to cause the test and measurement instrument to move and display the third badge between the first badge and the second badge.

Example 40 is the one or more computer-readable storage media of any one of examples 37-39, further comprising instructions configured to cause the test and measurement instrument to receive a selection to move a first badge over a second badge; indicate a grouping of the first badge and the second badge in response to the selection from the user to move the first badge over the second badge; and display the waveform associated with the first badge and the waveform associated with the second badge in the same slice in response to the selection from the user to move the first badge over the second badge.

Example 41 is the one or more computer-readable storage media of claim 40, further comprising instructions configured to cause the test and measurement instrument to group the first badge and the second badge and display the waveform associated with the first badge and the waveform associated with the second badge in the same slice when the first badge is greater than a first threshold across the second badge and less than a second threshold.

Example 42 is the one or more computer-readable storage media of example 41, further comprising instructions configured to cause the test and measurement instrument to move the first badge after the second badge when the first badge is greater than the second threshold across the second badge.

Example 43 is the one or more computer-readable storage media of either examples 41 or 42, wherein the first threshold is 25 percent and the second threshold is 75 percent.

Example 44 is the one or more computer-readable storage media of any one of examples 40-43, further comprising instructions configured to cause the test and measurement instrument to receive a selection of the first badge to move the first badge out of the grouping and in response place the first badge at an end of the order of the badges and display a slice with the waveform associated with the first badge at the bottom of the stacked slices.

Example 45 is the one or more computer-readable storage media of any one of examples 40-44, further comprising instructions configured to cause the test and measurement instrument to receive a selection to move the grouping and in response to moving the grouping, moving the slice associated with the grouping in the waveform viewing area.

Example 46 is a method for rearranging slices in a waveform viewing area of a display of a test and measurement instrument, comprising displaying the waveform viewing area having two or more slices displayed in a stacked manner, each slice associated with at least one waveform; displaying in a badge viewing area a badge associated with each waveform in the waveform viewing area, the badges displayed in order of the two or more slices; receiving a user input to reorder the badges displayed in the badge viewing area; and in response to a user input reordering the order of the badges, reordering the two or more slices in the order of the reordered badges.

Example 47 is the method of example 46, further comprising displaying a spacer between a first badge and a second badge when a third badge is being moved across the first badge.

Example 48 is the method of example 47, wherein when the third badge is released by a user at equal to or greater than a predetermined percentage across the first badge, further comprising moving and displaying the third badge between the first badge and the second badge.

Example 49 is the method of any one of examples 46-48, further comprising receiving a selection to move a first badge over a second badge; indicating a grouping of the first badge and the second badge in response to the selection from the user to move the first badge over the second badge; and displaying the waveform associated with the first badge and the waveform associated with the second badge in the same slice in response to the selection from the user to move the first badge over the second badge.

Example 50 is the method of example 49, further comprising grouping the first badge and the second badge and display the waveform associated with the first badge and the waveform associated with the second badge in the same slice when the first badge is greater than a first threshold across the second badge and less than a second threshold.

Example 51 is the method of example 50, further comprising moving the first badge after the second badge when the first badge is greater than the second threshold across the second badge.

Example 52 is the method of either one of examples 50 or 51, wherein the first threshold is 25 percent and the second threshold is 75 percent.

Example 53 is the method of any one of examples 49-52, further comprising receiving a selection of the first badge to move the first badge out of the grouping and in response place the first badge at an end of the order of the badges and displaying a slice with the waveform associated with the first badge at the bottom of the stacked slices.

Example 54 is the method of any one of examples 49-53, further comprising receiving a selection to move the grouping and in response to moving the grouping, moving the slice associated with the grouping in the waveform viewing area.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument, comprising:
a display; and
one or more processors configured to:
   display a waveform viewing area;
   receive a selection of a viewing mode;
   when an overlay viewing mode is selected, display two or more waveforms overlaid in a single graticule in the waveform viewing area; and
   when a stacked viewing mode is selected, display a first waveform in a first slice having a first graticule in the waveform viewing area and display a second waveform in a second slice having a second graticule below the first slice in the waveform viewing area, wherein the first slice and the second slice are time-aligned and have the same horizontal axis and the first slice and the second slice each have independent vertical axes.

2. The test and measurement instrument of claim 1, further comprising an analog-to-digital converter configured to digitize an analog input signal to the test and measurement instrument, wherein when the stacked viewing mode is selected, a vertical axis of each slice represents substantially the full input range of the analog-to-digital converter.

3. The test and measurement instrument of claim 1, wherein when the stacked viewing mode is selected, the one or more processors are further configured to display a third waveform, overlaid on the second waveform, in the second slice.

4. The test and measurement instrument of claim 3, wherein the one or more processors are further configured to display the second waveform and the third waveform overlaid in the second slice in response to a user selection to group the second waveform and the third waveform.

5. The test and measurement instrument of claim 4, wherein the one or more processors are further configured to display the third waveform in a third slice having a third graticule below the second slice in the waveform viewing area in response to a user selection to ungroup the second waveform and the third waveform.

6. The test and measurement instrument of claim 1, wherein when the stacked viewing mode is selected, the one or more processors are further configured to remove the first slice and the first waveform when a selection is received to remove the first waveform.

7. The test and measurement instrument of claim 1, wherein when the stacked viewing mode is selected, the one or more processors are further configured to display a third waveform in a third slice having a third graticule below the second slice in the waveform viewing area when a selection is received to add the third waveform.

8. One or more non-transitory computer-readable storage media comprising instructions, which, when executed by one or more processors of a test and measurement instrument, cause the test and measurement instrument to:
   display a waveform viewing area;
   receive a selection of a viewing mode;
   when an overlay mode is selected, display two or more waveforms overlaid in a single graticule in the waveform viewing area; and
   when a stacked mode is selected, display a first waveform in a first slice in the waveform viewing area and display a second waveform in a second slice below the first slice in the waveform viewing area, wherein the first slice and the second slice are time-aligned and have the same horizontal axis and the first slice and the second slice each have independent vertical axes.

9. The one or more non-transitory computer-readable storage media of claim 8, wherein the test and measurement instrument includes an analog-to-digital converter configured to digitize an analog input signal to the test and measurement instrument, further comprising instructions configured to cause the test and measurement instrument to receive an autoset selection, and in response to the autoset selection, set each waveform in each slice to be in a middle 80 percent range of the analog-to-digital converter.

10. The one or more non-transitory computer-readable storage media of claim 8, wherein when the stacked mode is selected, further comprising instructions configured to cause the test and measurement instrument to display a third waveform, overlaid on the second waveform, in the second slice.

11. The one or more non-transitory computer-readable storage media of claim 8, further comprising instructions configured to cause the test and measurement instrument to remove the first slice and the first waveform based on a user input to remove the first waveform.

12. The one or more non-transitory computer-readable storage media of claim 8, further comprising instructions configured to cause the test and measurement instrument to display a third waveform in a third slice having a third graticule below the second slice in the waveform viewing area based on a user input to add the third waveform.

13. The one or more non-transitory computer-readable storage media of claim 8, further comprising instructions configured to cause the test and measurement instrument to receive the selection of the viewing mode from a user interface.

14. A test and measurement instrument, comprising:
a display; and
one or more processors configured to:
   display a waveform viewing area having two or more slices displayed in a stacked manner, each slice associated with at least one waveform, wherein the two or more slices are time-aligned and have the same horizontal axis and the two or more slices each have independent vertical axes;
   display in a badge viewing area a badge associated with each waveform in the waveform viewing area, the badges displayed in order of the two or more slices;
   receive a user input to reorder the badges displayed in the badge viewing area; and
   in response to the reordering of the badges, reorder the two or more slices in the order of the reordered badges.

15. The test and measurement instrument of claim 14, wherein the one or more processors are further configured to display a spacer between a first badge and a second badge when a third badge is being moved across the first badge.

16. The test and measurement instrument of claim 15, wherein when the third badge is released by a user at equal to or greater than a predetermined percentage across the first badge, the one or more processors are further configured to move and display the third badge between the first badge and the second badge.

17. The test and measurement instrument of claim 14, wherein the one or more processors are further configured to:
   receive a selection to move a first badge over a second badge;

indicate a grouping of the first badge and the second badge in response to the selection from the user to move the first badge over the second badge; and display the waveform associated with the first badge and the waveform associated with the second badge in the same slice in response to the selection from the user to move the first badge over the second badge.

18. The test and measurement instrument of claim 17, wherein the one or more processors are further configured to group the first badge and the second badge and display the waveform associated with the first badge and the waveform associated with the second badge in the same slice when the first badge is greater than a first threshold across the second badge and less than a second threshold.

19. The test and measurement instrument of claim 17, wherein the one or more processors are further configured to receive a selection of the first badge to move the first badge out of the grouping and in response place the first badge at an end of the order of the badges and display a slice with the waveform associated with the first badge at the bottom of the stacked slices.

20. The test and measurement instrument of claim 17, wherein the one or more processors are further configured to receive a selection to move the grouping and in response to moving the grouping, move the slice associated with the grouping in the waveform viewing area.

\* \* \* \* \*